United States Patent
Kim et al.

(10) Patent No.: US 9,865,652 B2
(45) Date of Patent: Jan. 9, 2018

(54) THRESHOLD SWITCHING DEVICE AND ELECTRONIC DEVICE INCLUDING THE SAME

(71) Applicant: SK hynix Inc., Icheon (KR)

(72) Inventors: Kyung-Wan Kim, Icheon (KR); Jong-Chul Lee, Icheon (KR); Jong-Gi Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/182,509

(22) Filed: Jun. 14, 2016

(65) Prior Publication Data

US 2017/0186813 A1 Jun. 29, 2017

(30) Foreign Application Priority Data

Dec. 29, 2015 (KR) .................. 10-2015-0188655

(51) Int. Cl.

| | |
|---|---|
| *G11C 11/00* | (2006.01) |
| *H01L 27/24* | (2006.01) |
| *H01L 45/00* | (2006.01) |
| *H01L 27/22* | (2006.01) |
| *H01L 27/11507* | (2017.01) |
| *H01L 27/1159* | (2017.01) |

(Continued)

(52) U.S. Cl.

CPC ........ *H01L 27/2427* (2013.01); *G06F 3/0619* (2013.01); *G06F 3/0656* (2013.01); *G06F 3/0659* (2013.01); *G06F 3/0683* (2013.01); *G06F 12/0802* (2013.01); *H01L 27/1159* (2013.01); *H01L 27/11507* (2013.01); *H01L 27/224* (2013.01); *H01L 45/04* (2013.01); *H01L 45/06* (2013.01); *H01L 45/08* (2013.01); *H01L 45/1233* (2013.01); *H01L 45/141* (2013.01); *H01L 45/145* (2013.01); *H01L 45/146* (2013.01); *H01L 45/147* (2013.01); *H01L 45/165* (2013.01); *G06F 2212/60* (2013.01)

(58) Field of Classification Search

CPC ............................................ G11C 11/14–11/16
USPC ........................ 365/148, 163, 158, 171, 173
See application file for complete search history.

(56) References Cited

U.S. PATENT DOCUMENTS

| | | |
|---|---|---|
| 7,869,259 B2 | 1/2011 | Asao |
| 8,008,648 B2 | 8/2011 | Bratkovski et al. |

(Continued)

FOREIGN PATENT DOCUMENTS

| | | |
|---|---|---|
| KR | 10-2017-0059517 A | 5/2017 |
| KR | 10-2017-0078299 A | 7/2017 |

OTHER PUBLICATIONS

Sung Hyun Jo et al., "3D-stackable Crossbar Resistive Memory based on Field Assisted Superlinear Threshold (FAST) Selector", IEDM 14-160, 2014, pp. 6.7.1-6.7.4, IEEE.

(Continued)

*Primary Examiner* — Han Yang

(57) ABSTRACT

A threshold switching device may include: a first electrode layer; a second electrode layer; an insulating layer interposed between the first and second electrode layers and containing a plurality of neutral defects; and an additional insulating layer interposed between the insulating layer and one or each of the first and second electrode layers, and being substantially free from neutral defects, and wherein the threshold switching device has an ON or OFF state according to whether electrons are ejected from the plurality of neutral defects.

22 Claims, 13 Drawing Sheets

(51) Int. Cl.
*G06F 3/06* (2006.01)
*G06F 12/0802* (2016.01)

(56) References Cited

U.S. PATENT DOCUMENTS

| | | |
|---|---|---|
| 8,766,234 B1 | 7/2014 | Hashim et al. |
| 9,184,382 B2 | 11/2015 | Pickett et al. |
| 9,231,203 B1 * | 1/2016 | Tendulkar ............. H01L 45/145 |
| 9,595,668 B2 | 3/2017 | Govoreanu |
| 2010/0102289 A1 * | 4/2010 | Dimitrov ........... G11C 13/0007 257/2 |
| 2015/0313046 A1 | 10/2015 | Barabash et al. |
| 2017/0148983 A1 | 5/2017 | Lee et al. |
| 2017/0186812 A1 | 6/2017 | Lee et al. |

OTHER PUBLICATIONS

Office Action from U.S. Patent Office for U.S. Appl. No. 15/182,499, dated Jul. 5, 2017.

\* cited by examiner

THRESHOLD SWITCHING DEVICE AND ELECTRONIC DEVICE INCLUDING THE SAME

CROSS-REFERENCE TO RELATED APPLICATIONS

The present application claims priority of Korean Patent Application No. 10-2015-0188655, entitled "THRESHOLD SWITCHING DEVICE AND ELECTRONIC DEVICE INCLUDING THE SAME" and filed on Dec. 29, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a new threshold switching device.

In an implementation, a threshold switching device may include: a first electrode layer; a second electrode layer; an insulating layer interposed between the first and second electrode layers and containing a plurality of neutral defects; and an additional insulating layer interposed between the insulating layer and one or each of the first and second electrode layers, and being substantially free from neutral defects, and wherein the threshold switching device has an ON or OFF state according to whether electrons are ejected from the plurality of neutral defects.

Implementations of the above threshold switching device may include one or more the following.

The additional insulating layer includes a different insulating material than the insulating layer. The additional insulating layer includes an insulating material that has a larger resistance than the insulating layer. The insulating layer includes a doped material, and the additional insulating layer includes an undoped material. When no voltage is applied to the first and second electrode layers, the plurality of neutral defects have substantially the same energy level as or a lower energy level than a work function of the first and second electrode layers. The plurality of neutral defects in the insulating layer are arranged at predetermined intervals along a first direction toward the second electrode layer from the first electrode layer. When a relatively positive voltage is applied to the second electrode layer in comparison to the first electrode layer, the ejection of electrons is sequentially performed starting from neutral defects close to the second electrode layer and progressing to neutral defects close to the first electrode layer. The insulating layer includes a first insulating layer adjacent to the first electrode layer and a second insulating layer adjacent to the second electrode layer, and a concentration of plurality of the neutral defects is at a maximum along an interface between the first insulating layer and the second insulating layer. The concentration of the plurality of neutral defects decreases along a direction away from the interface between the first insulating layer and the second insulating layer. The insulating layer includes donor impurities. In the ON state, an ohmic contact is formed by the ejection of electrons from the plurality of neutral defects and formed between the first electrode layer and the insulating layer, between the second electrode layer and the insulating layer, or both, and in the OFF state, a Schottky contact is formed by maintaining the plurality of neutral defects without the electrons being ejected, and formed between the first electrode layer and the insulating layer, between the second electrode layer and the insulating layer, or both. A current flowing through the insulating layer in the OFF state decreases when a height of a Schottky barrier increases, the Schottky barrier being formed between the first electrode layer and the insulating layer, between the second electrode layer and the insulating layer, or both. A current flowing through the insulating layer in the ON state increases according to an increased concentration of the plurality of neutral defects. The additional insulating layer includes a material having a lower diffusivity with respect to impurities than the insulating layer.

In an implementation, there is provided an electronic device including a semiconductor memory. The semiconductor memory may include: a memory element suitable for storing data; and a selecting element coupled to the memory element and suitable for controlling access to the memory element. The selecting element may include: a first electrode layer; a second electrode layer; an insulating layer interposed between the first and second electrode layers and containing a plurality of neutral defects; and an additional insulating layer interposed between the insulating layer and one or each of the first and second electrode layers, and being substantially free from neutral defects, and wherein the threshold switching device has an ON or OFF state according to whether electrons are ejected from the plurality of neutral defects.

Implementations of the above electronic device may include one or more the following.

The semiconductor memory further comprises: a first line extending in a first direction; and a second line extending in a second direction crossing the first direction, and the memory element and the selecting element are positioned at an intersection between the first and second lines. The memory element comprises a variable resistance element which switches between different resistance states according to a voltage or current applied thereto.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations and associated advantages are described in greater detail in the drawings, the description and the claims.

DETAILED DESCRIPTION

Figure 1A:
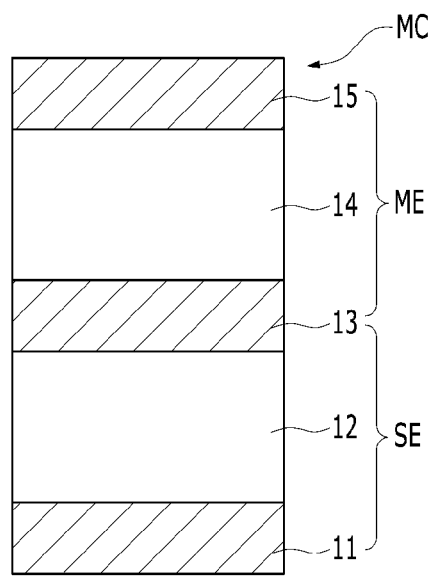
FIG. 1A illustrates a cross-sectional view of a memory cell in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
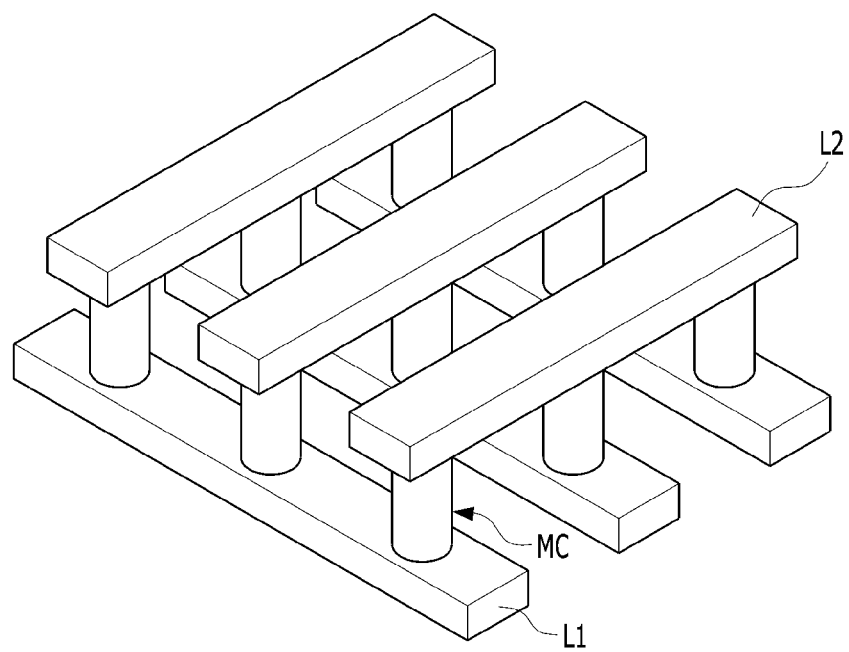
FIG. 1B illustrates a perspective view of a cell array including the memory cell of FIG. 1A.

FIG. 1A illustrates a cross-sectional view of a memory cell in accordance with an implementation, and FIG. 1B illustrates a perspective view of a cell array including the memory cell of FIG. 1A.

Referring to FIG. 1A, the memory cell MC in accordance with the implementation may include a memory element ME for storing data and a selecting element SE for controlling access to the memory element ME.

The memory element ME may include second and third electrodes 13 and 15 and a variable resistance layer 14 interposed between the second and third electrodes 13 and 15.

The second and third electrodes 13 and 15 transfer a voltage or current applied to the memory cell MC to the variable resistance layer 14. Each of the second and third electrodes 13 and 15 may be formed of any of various conductive materials such as a metal, a metal nitride, and a combination thereof.

The variable resistance layer 14 may have a variable resistance characteristic that switches between different resistance states according to a voltage or current supplied thereto, and thus may store different data depending on the resistance states. For example, when the variable resistance layer 14 has a high resistance state, data '0' may be stored therein, and when the variable resistance layer 14 has a low resistance state, data '1' may be stored therein. The variable resistance layer 14 may have a single-layer or multilayer structure including at least one of various materials used for RRAM, PRAM, FRAM, MRAM and the like. For example, the various materials may include a metal oxide such as a perovskite-based material, a transition metal oxide, etc, a phase change material such as a chalcogenide-based material, a ferrodielectric material, and a ferromagnetic material.

A resistance value of the variable resistance layer 14 may be changed according to whether a conductive path is formed therein or not. That is, when a conductive path passing through the variable resistance layer 14 is formed in the variable resistance layer 14, the variable resistance layer 14 may have the low resistance state. On the other hand, when the conductive path disappears from the variable resistance layer 14, the variable resistance layer 14 may have the high-resistance state. For example, when the variable resistance layer 14 includes a metal oxide containing a large quantity of oxygen vacancies, a conductive path may be formed in or disappear from the variable resistance layer 14, according to the behavior of the oxygen vacancies. The conductive path may be formed in various manners according to a type, layer structure, or operational characteristic of the variable resistance layer 14.

The selecting element SE may include a first electrode 11, the second electrode 13, and a selecting element layer 12 interposed between the first and second electrodes 11 and 13.

The first and second electrodes 11 and 13 transfer a voltage or current applied to the memory cell MC to the selecting element layer 12. Each of the first and second electrodes 11 and 13 may be formed of any of various conductive materials such as a metal, a metal nitride, and a combination thereof. In this implementation, the second electrode 13 may be interposed between the selecting element layer 12 and the variable resistance layer 14, and function as a common electrode of the selecting element SE and the memory element ME. The second electrode 13 distinguishes between the selecting element layer 12 and the variable resistance layer 14.

The selecting element layer 12 may have a threshold switching characteristic. Thus, the selecting element layer 12 substantially blocks a current flow therein when a magnitude of a voltage or current supplied thereto is less than a predetermined threshold value. On the other hand, the selecting element layer 12 passes a rapidly-increasing current when the magnitude of the voltage or current supplied thereto is equal to or greater than the predetermined threshold value. In the present implementation, the selecting element layer 12 may be formed of an insulating material including a plurality of neutral defects. The selecting element layer 12 in accordance with the implementation will be described in more detail with reference to FIG. 2.

The selecting element layer 12 may be used to prevent a leakage current between memory cells MC in a cross-point cell array illustrated in FIG. 1B.

Referring to FIG. 1B, the cell array may include parallel first lines L1 extending in a first direction, parallel second lines L2 positioned over the first lines L1 and extending in a second direction crossing the first direction, and memory cells MC positioned at the respective intersections of the first lines L1 and the second lines L2 and disposed between the first lines L1 and the second lines L2.

When a voltage having a value V is applied to a selected memory cell in the cell array through selected first and second lines L1 and L2 coupled to the selected memory cell, a voltage having a value ½ V may be applied to an unselected memory cell sharing the selected first or second line L1 or L2 with the selected memory cell. Thus, if the selecting element layer 12, which blocks a current flow therein when the applied voltage has a value of ½ V or less, does not exist in the unselected memory cell, a leakage current may flow through the unselected memory cell.

When a state in which the selecting element layer 12 substantially blocks a current flow therein is referred to as an OFF state and a state in which a current or voltage equal to or greater than the predetermined threshold value is applied to the selecting element layer 12 so that the selecting element layer 12 passes a current therethrough is referred to as an ON state, a material, which has a low off-current Ioff and a high on-current Ion and thus has a high on/off ratio, may be used to form the selecting element layer 12. In the present implementation, an insulating material including a plurality of neutral defects may be used as the material to form the selecting element layer 12. The insulating material's structure, operational mechanism, characteristics, and effects will be described in more detail with reference to FIGS. 2 to 7.

Figure 2:
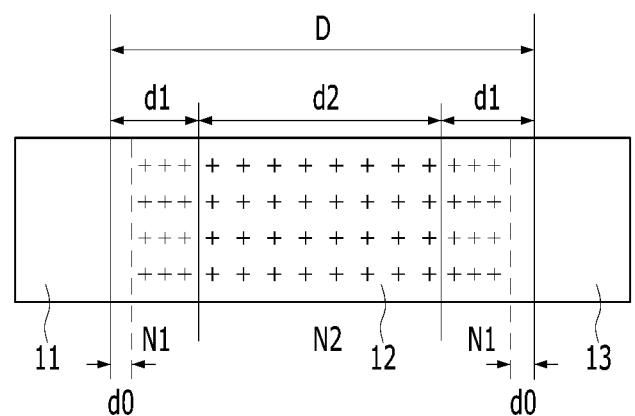
FIG. 2 illustrates a cross-sectional view of a selecting element in accordance with an implementation.
Figure 3:
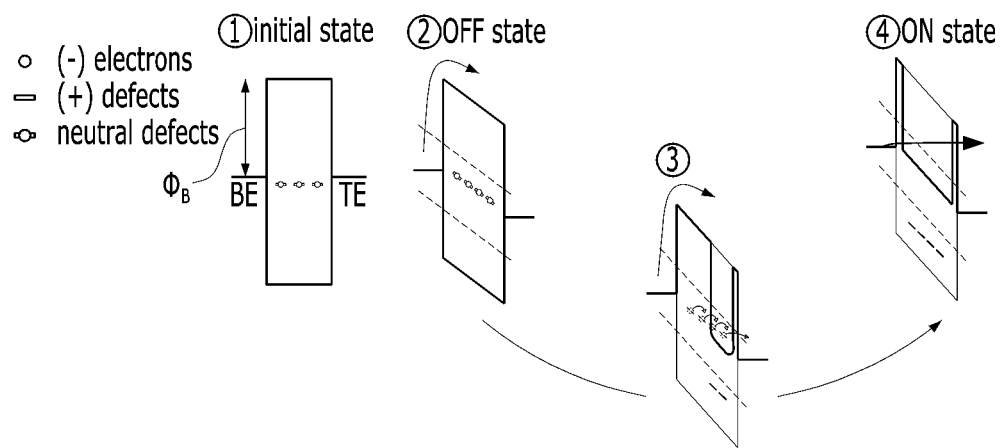
FIG. 3 is an energy band diagram for describing an operational mechanism of the selecting element of FIG. 2.

FIG. 2 illustrates a cross-sectional view of a selecting element in accordance with an implementation. FIG. 3 is an energy band diagram for describing an operational mechanism of the selecting element of FIG. 2.

Referring to FIG. 2, the selecting element layer 12 interposed between the first and second electrodes 11 and 13 may be formed of an insulating material containing a plurality of neutral defects (refer to symbols '+' in FIG. 2). The neutral defect may correspond to an immobile (+) defect when a mobile (−) electron is ejected from the neutral defect. Combining the immobile (+) defect and the mobile (−) electron results in the neutral defect.

The selecting element layer 12 may include an interface part d0, an end part d1, and a central part d2. The interface part d0 may be in a region that is within a first predetermined distance from an interface between the first electrode 11 and the selecting element layer 12 or a region that is within the first predetermined distance from an interface between the second electrode 13 and the selecting element layer 12. The interface part d0 may have a thickness, i.e., the first predetermined distance, which is equal to or less than ¹/₁₀ of the entire thickness D of the selecting element layer 12.

The end part d1 may be a region that is within a second predetermined distance from the interface between the first electrode 11 and the selecting element layer 12 or a region that is within the second predetermined distance from the interface between the second electrode 13 and the selecting element layer 12. The second predetermined distance may be larger than the first predetermined distance, such that the end part d1 may include the interface part d0.

The central part d2 may be a region disposed between the two end parts d1. The central part d2 may have a thickness equal to or greater than the sum of the thicknesses of the two end parts d1.

The plurality of neutral defects may be distributed in the entire part of the selecting element layer 12, except the interface parts d0 of the selecting element layer 12. In other words, neutral defects may be distributed at predetermined intervals along a direction connecting the first and second electrodes 11 and 13, but may not be distributed in the interface part d0 of the selecting element layer 12. This is because electron ejection for setting the selecting element SE to the ON state may sequentially occur from neutral defects closer to an electrode to which a relatively positive voltage is applied between the first and second electrodes 11 and 13.

When the neutral defects are in contact with the first and second electrodes 11 and 13 or very close to the first and second electrodes 11 and 13, these neutral defects may serve as leakage sources. Therefore, in an implementation, it is desirable that the interface part d0 does not contain any neutral defects. Although the neutral defects may exist in the interface part d0, an amount of the neutral defects in the interface part d0 may be minimal compared to other portions.

Except for the interface part d0, the density (or concentration) of the neutral defects in the selecting element layer 12 may be changed in various manners. The on-current of the selecting element layer 12 may increase as the density of the neutral defects and/or the total number of the neutral defects in other portions except for the interface part d0 increases, thereby increasing the on/off ratio. Furthermore, when the density of neutral defects in the end part d1 excluding the interface part d0 is represented by N1 and the density of neutral defects in the central part d2 is represented by N2, N1 may be higher than N2. That is, the end part d1 may have a higher neutral defect density than the central part d2. In this case, the increase in the on-current and the on/off ratio may be more noticeable. Therefore, intervals between neutral defects in the end part d1 may be smaller than intervals between neutral defects in the central part d2. However, each of the intervals between the neutral defects in the end part d1 and the intervals between the neutral defects in the central part d2 may be substantially constant. The effect due to the neutral defect density difference in the end part d1 and the central part d2 will be described in more detail with reference to FIGS. 7 and 8.

In the selecting element, the first and second electrodes 11 and 13 may be formed of a same material, and have a same work function.

The operational mechanism of the selecting element SE will be briefly described with reference to FIG. 3.

Referring to FIG. 3, in an initial state ① in which no voltage is applied to the first and second electrodes 11 and 13, an energy level of neutral defects in the selecting element layer 12 may be substantially the same as or a slightly lower than the work function of the first and second electrodes 11 and 13. The first electrode 11 and the selecting element layer 12, and/or the second electrode 13 and the selecting element layer 12 may form a Schottky contact having a Schottky barrier height $\Phi_B$ that is equal to or greater than a predetermined threshold value.

In a state ② in which a voltage is applied to the first and second electrodes 11 and 13, an energy band of neutral defects in the selecting element layer 12 is bent. In the present implementation, a relatively positive voltage may be applied to the second electrode 13, compared to the first electrode 11. For example, 0 V may be applied to the first electrode 11, and a positive voltage may be applied to the second electrode 13. In an OFF state, supposing a voltage required for ejecting electrons from neutral defects is a threshold voltage, a voltage applied to the first and second electrodes 11 and 13 may be less than the threshold voltage. The state ② in which electrons are not yet ejected from neutral defects even though the energy band is bent may be referred to as the OFF state. The OFF state may be distinguished from the initial state ① in which the energy band is not bent because no voltage is applied. In the OFF state, the first electrode 11 and the selecting element layer 12, and/or the second electrode 13 and the selecting element layer 12 may still form the Schottky contact.

Then, in a state ③ in which the voltage applied to the first and second electrodes 11 and 13 reaches the threshold voltage, electrons may be ejected from the neutral defects, and migrate to the second electrode 13 to which the positive voltage is applied. The ejection of electrons may be sequentially performed starting from neutral defects close to the second electrode 13 and progressing to neutral defects close to the first electrode 11. Thus, defects possessing a positive charge, that is, (+) defects, may be sequentially generated, in the selecting element layer 12, starting from a portion close to the second electrode 13 and progressing to a portion close to the first electrode 11. The (+) defects may reduce an energy level of a corresponding region of the selecting element layer 12. Thus, a thickness of a Schottky barrier may gradually decrease.

As a result, when the ejection of electrons and the generation of (+) defects are completed for the neutral defects in the selecting element layer 12, the first electrode 11 and the selecting element layer 12, and/or the second electrode 13 and the selecting element layer 12 may form an ohmic contact through which electron tunneling may occur between the selecting element layer 12 and the first electrode 11 and/or between the selecting element layer 12 and the second electrode 13, as illustrated in a state ④. That is, the selecting element layer 12 may be set in an ON state. In this state, the Schottky barrier may have a small thickness corresponding to that of the interface part d0 of the selecting element layer 12, and the selecting element layer 12 may not include neutral defects anymore.

After that, if the voltage applied to the first and second electrodes 11 and 13 is removed, electrons, which migrated from the selecting element layer 12 to the second electrode 13 through the electron tunneling, may return to the selecting element layer 12 and recombine with the (+) defects so as to form neutral defects in the selecting element layer 12. That is, the initial state ① may be restored. The recovery of the neutral defects can be achieved because the energy level of the neutral defects is almost the same as or slightly lower than the work function of the first and second electrodes 11 and 13 and thus the electrons can easily migrate to the selecting element layer 12.

The element of FIG. 2 is coupled to a memory element ME, in order to function as a selecting element SE. In another implementation, the element of FIG. 2 may be independently used as a threshold switching element.

Figure 4:
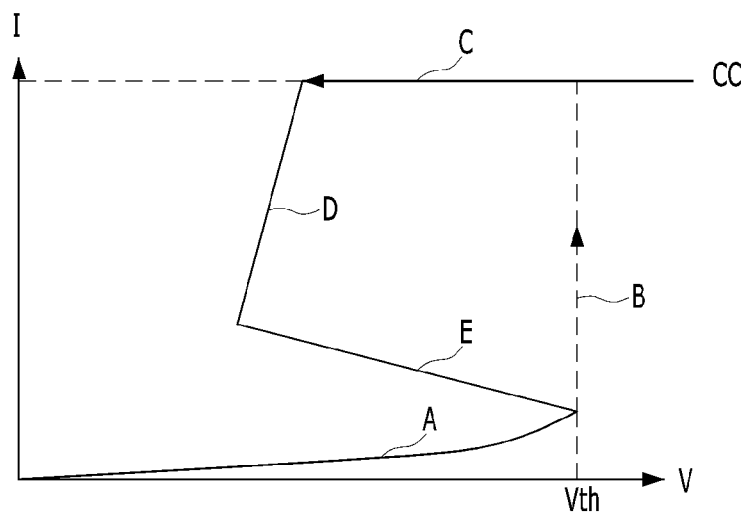
FIG. 4 illustrates a current-voltage curve for describing characteristics of the selecting element of FIG. 2.

FIG. 4 illustrates a current-voltage curve for describing a characteristic of the selecting element of FIG. 2.

Referring to a line 'A' of FIG. 4, when the voltage applied to the selecting element gradually increases, a current flowing through the selecting element may slightly increase until the voltage reaches a predetermined threshold voltage Vth. While the current flowing through the selecting element slightly increases, the selecting element may be set in the OFF state, and the current flow may be caused by Schottky emission.

Referring to a line 'B', when the voltage applied to the selecting element reaches the predetermined threshold voltage Vth, the current flow may rapidly increase. That is, the selecting element may be set in the ON state. At this time, a magnitude of the current may be limited to a compliance current (CC) because, when the magnitude of the current increases without limit, the selecting element layer 12 may break down.

Referring to a line 'C', the magnitude of the current flowing through the selecting element may be constantly maintained even though the voltage applied to the selecting element gradually decreases. That is, the selecting element may maintain the ON state.

Referring to a line 'D', when the voltage applied to the selecting element decreases and thus reaches a predetermined value, a current sweep may be performed so that the current flowing through the selecting element rapidly decreases. During this operation, the voltage applied to the selecting element may be reduced at a relatively small rate, and the selecting element may maintain the ON state.

Referring to a line 'E', when the current flowing through the selecting element reaches a predetermined value that is greater than the current at the threshold voltage Vth and smaller than the compliance current (CC), the magnitude of the voltage applied to the selecting element may be increased again until the voltage reaches the threshold voltage Vth. During this operation, the magnitude of the current flowing through the selecting element may decrease at a relatively small rate. This is because the thickness of the Schottky barrier gradually increases, compared to when the selecting element is in the ON state.

Referring back to the line 'A', when the voltage applied to the selecting element reaches the threshold voltage Vth again, the selecting element may be set in the OFF state. Thus, although a voltage is applied to the selecting element, a current flow may be substantially blocked.

Figure 5:
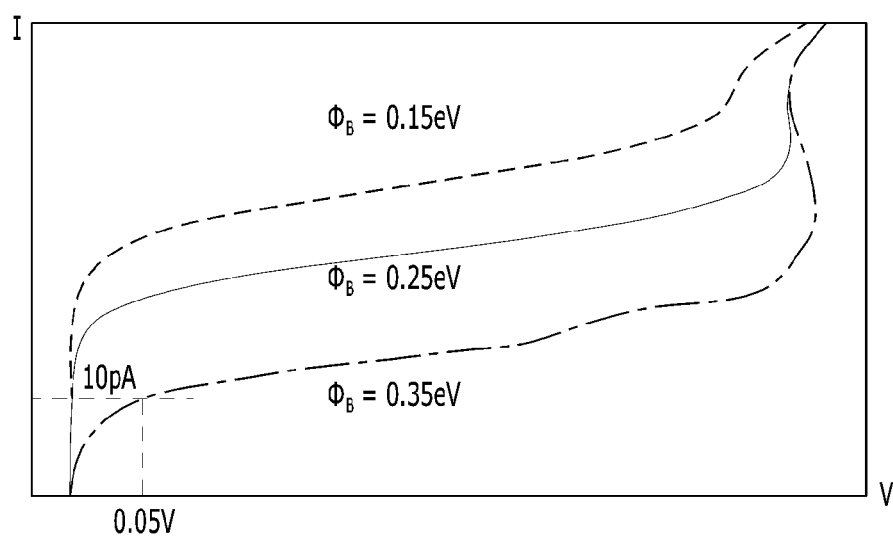
FIG. 5 illustrates a current-voltage curve for describing an off-current of the selecting element of FIG. 2.

FIG. 5 illustrates a current-voltage curve for describing an off-current of the selecting element of FIG. 2.

Referring to FIG. 5, the off-current of the selecting element may decease with the increase in height $\Phi_B$ of the Schottky barrier formed between the first electrode 11 and the selecting element layer 12 and/or between the second electrode 13 and the selecting element layer 12.

However, when the Schottky barrier height $\Phi_B$ excessively increases, the selecting element cannot be set to the ON state. Thus, the Schottky barrier height $\Phi_B$ needs to be properly adjusted.

For example, referring to FIG. 5, when a target value of the off-current is equal to or less than 10 pA at a voltage of about 0.05 V, the Schottky barrier height $\Phi_B$ may be set to 0.35 eV or more, thereby satisfying the target value.

Figure 6:
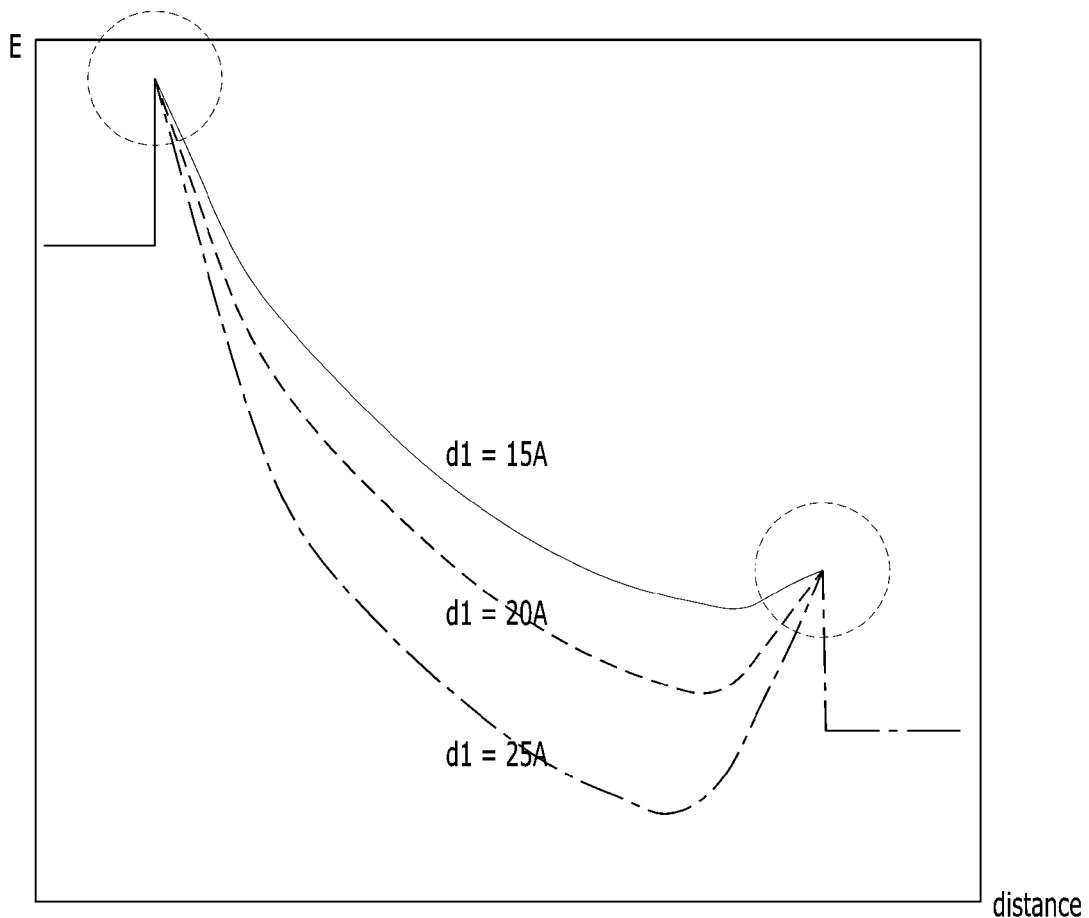
FIG. 6 illustrates energy levels of the selecting element of FIG. 2.

FIG. 6 is a diagram for describing an energy level of the selecting element of FIG. 2. In FIG. 6, the horizontal axis may indicate a distance from the interface between the first electrode 11 and the selecting element layer 12 and/or the interface between the second electrode 13 and the selecting element layer 12, and the vertical axis may indicate an energy level.

FIG. 6 is related to a case in which the Schottky barrier height $\Phi_B$, set to 0.35 eV, 0 V, and 1 V, is applied to the first and second electrodes 11 and 13, the interface part d0 of the selecting element layer 12 has a thickness of 10 Å, and the density N1 of neutral defects in the end part d1 of the selecting element layer 12 and the density N2 of neutral defects in the central part d2 are 5e19/cm$^3$ and 5e18/cm$^3$, respectively.

Referring to FIG. 6, when the entire thickness D of the selecting element layer 12 is 100 Å, an energy level of the selecting element layer 12 excluding the interface part d0 may gradually decrease as the thickness of the end part d1 of the selecting element layer 12 is gradually increased to 15 Å, 20 Å, and 25 Å.

That is, as a thickness of a region having a high density of neutral defects is increased or the total number of neutral defects increases, the energy level of the selecting element layer 12 may decrease.

As the energy level of the selecting element layer 12 decreases, the thickness of the Schottky barrier at the interface between the first electrode 11 and the selecting element layer 12 and/or at the interface between the second electrode 13 and the selecting element layer 12 may be reduced (refer to a dotted circle). As a result, a magnitude of an on-current of the selecting element may increase.

Figure 7:
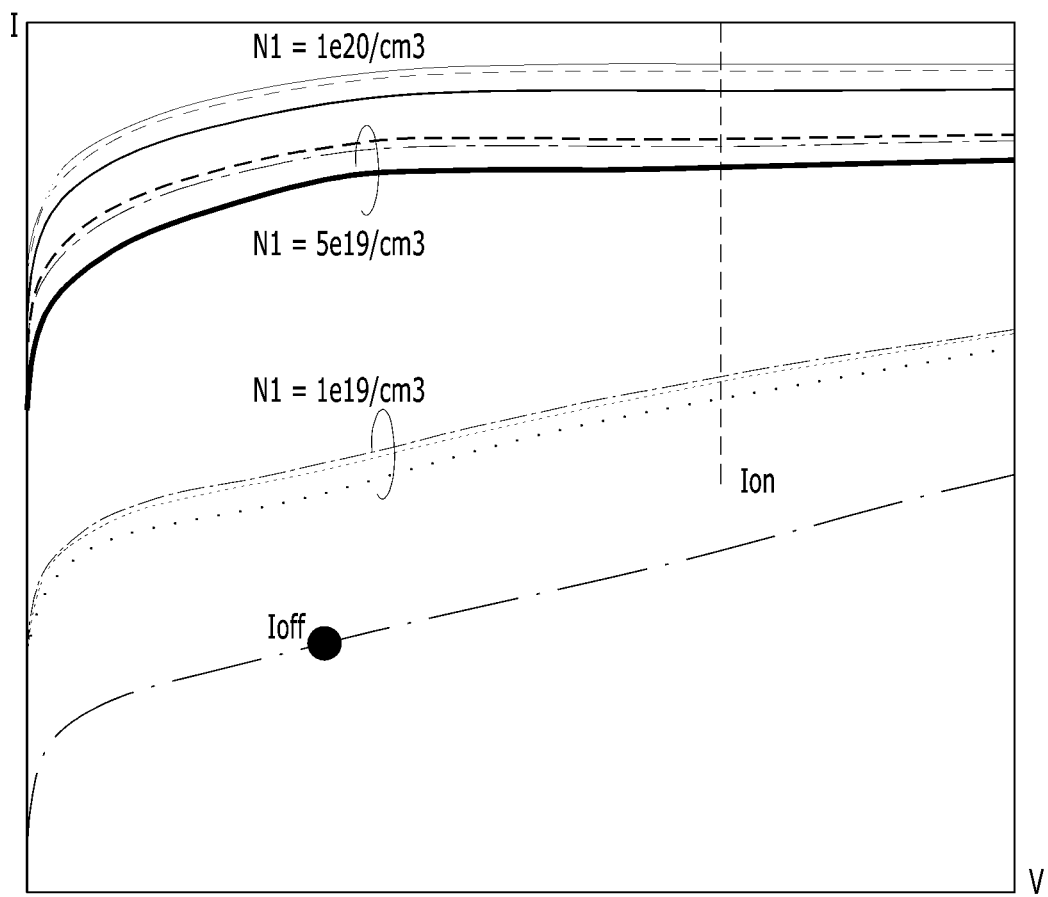
FIG. 7 illustrates a current-voltage curve for describing an on-current of the selecting element of FIG. 2.

FIG. 7 illustrates a current-voltage curve for describing an on-current of the selecting element of FIG. 2. FIG. 7 is related to a case in which the Schottky barrier height $\Phi_B$, set to 0.35 eV, 0 V, and 1 V, is applied to the first and second electrodes 11 and 13, the interface part d0 of the selecting element layer 12 has a thickness of 10 Å, the thicknesses of the end part d1 and the central part d2 of the selecting element layer 12 are constant, and the density N2 of neutral defects in the central part d2 of the selecting element layer 12 is approximately 1/10 of the density N1 of neutral defects in the end part d1.

Referring to FIG. 7, as the density N1 of neutral defects in the end part d1 of the selecting element layer 12 increases, the magnitude of the on-current may increase.

The magnitude of the off-current may not be influenced by the density N1 of neutral defects in the end part d1. Thus, as the density N1 of neutral defects in the end part d1 of the selecting element layer 12 increases, an on/off ratio, i.e., a ratio of an on-current to an off-current, may increase.

Figure 8:
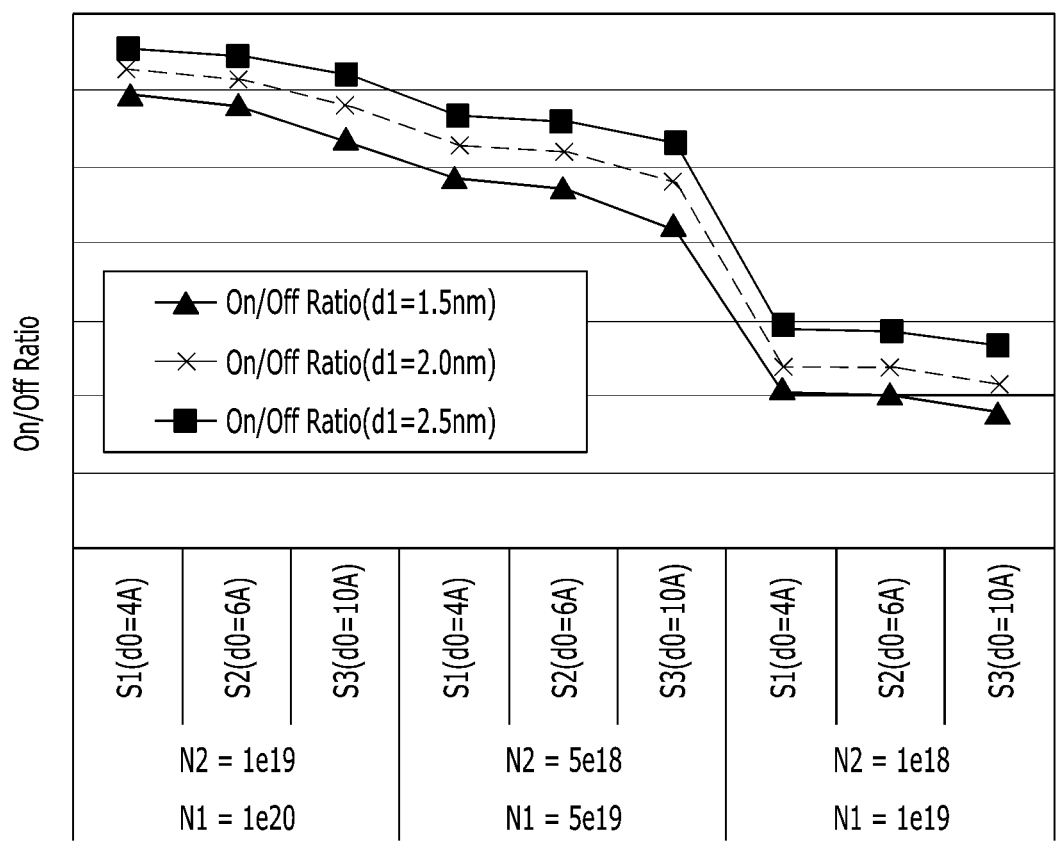
FIG. 8 describes an on/off ratio of the selecting element of FIG. 2.

FIG. 8 is a diagram for describing an on/off ratio of the selecting element of FIG. 2. FIG. 8 is related to a case in which the Schottky barrier height $\Phi_B$, set to 0.35 eV, and 0 V, and 1 V, is applied to the first and second electrodes 11 and 13. The thickness of the interface part d0 of the selecting element layer 12, the thickness of the end part d1 of the selecting element layer 12, and the densities N1 and N2 of neutral defects in the end part d1 and the central part d2 of the selecting element layer 12 may be set to various values. The density N2 of neutral defects in the central part d2 of the selecting element layer 12 may have a value corresponding to approximately 1/10 of the density N1 of neutral defects in the end part d1.

Referring to FIG. 8, when the thickness of the end part d1 of the selecting element layer 120 is increased, the on/off ratio may increase. Furthermore, when the density N1 of neutral defects in the end part d1 of the selecting element layer 120 increases, the on/off ratio may increase.

Furthermore, when the thickness of the interface part d0 of the selecting element layer 12 is increased, the on/off ratio may slightly decrease.

Meanwhile, the selecting element may be implemented in various manners, an example of which will be described with reference to FIGS. 9A to 9D below.

FIGS. 9A to 9D illustrate a selecting element in accordance with an implementation and a method for fabricating the same.

Figure 9A:
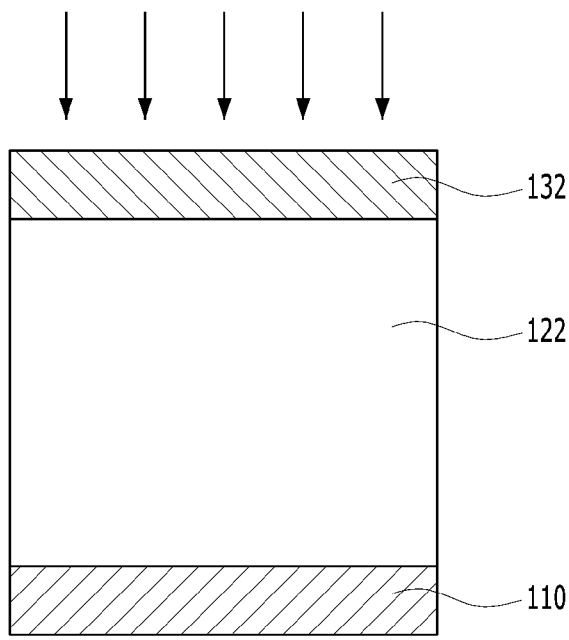
FIGS. 9A to 9D illustrate a selecting element in accordance with an implementation and a method for fabricating the same.

Referring to FIG. 9A, a first initial insulating layer 122 may be formed over a first electrode 110. The first initial insulating layer 122 may include an oxide such as a silicon oxide, a metal oxide, etc., or a nitride such as a silicon nitride, etc. The first initial insulating layer 122 may include a material which does not include impurities, that is, an undoped material.

Subsequently, impurities for forming neutral defects may be implanted into the first initial insulating layer 122. The implantation of the impurities may be performed in a direction from a top surface of the first initial insulating layer 122 toward a bottom surface of the first initial insulating layer 122 (see the arrows of FIG. 9A). The implantation of the impurities may be performed by an ion implantation process or a plasma doping process. The impurities may include donor impurities such as As, N, P, etc. The implantation of the impurities may be performed when a barrier layer 132 is formed over the first initial insulating layer 122.

The barrier layer 132 may include a conductive material or an insulating material, may be easily removed in a subsequent process, and may have a substantially small thickness. For example, the thickness of the barrier layer 132 may be smaller than the thickness of either one of the first electrode 110 and the first initial insulating layer 122. The barrier layer 132 may be removed after the implantation of the impurities into the first initial insulating layer 122.

Figure 9B:
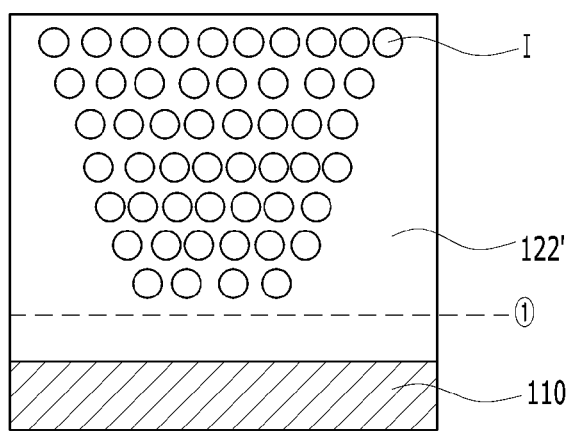

According to an implementation of this process, the impurities may penetrate into the first initial insulating layer 122 to a lower position that is spaced apart from the top surface of the first initial insulating layer 122 by a predetermined distance (see the dotted line ① in FIG. 9B). As a result, as shown in FIG. 9B, a first insulating layer 122' containing the impurities, which are distributed from the top surface to the lower position, may be obtained.

In order to control a penetration depth of the impurities, conditions of the implantation process, for example, ion implantation energy, may be controlled. Considering the direction of the implantation process, the concentration of the impurities may decrease from the top surface toward the bottom surface of the first insulating layer 122'. Therefore, the concentration (or density) of the neutral defects may decrease along a direction pointing from the top surface to the bottom surface of the first insulating layer 122'. The impurities or neutral defects distributed in the first insulating layer 122' may be represented by I.

Figure 9C:
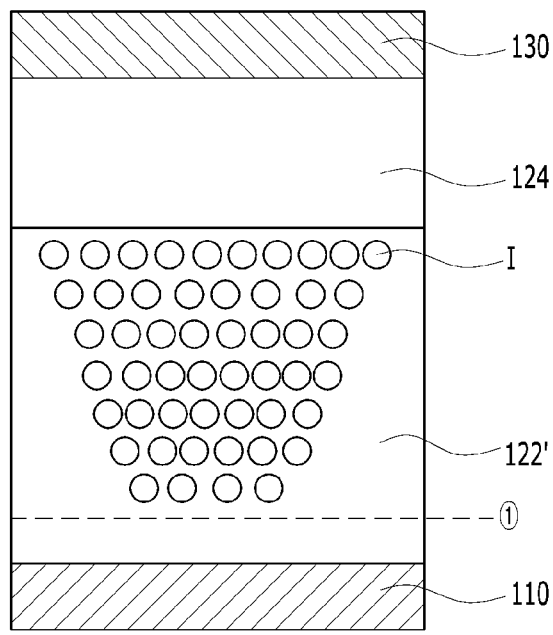

Referring to FIG. 9C, a second initial insulating layer 124 may be formed over the first insulating layer 122'. The second initial insulating layer 124 may include an oxide such as a silicon oxide, a metal oxide, etc., or a nitride such as a silicon nitride, etc. The second initial insulating layer 124 may include a material which does not include impurities, that is, an undoped material. The second initial insulating layer 124 may be formed of a material substantially the same as the material of the first initial insulating layer 122. That is, the first initial insulating layer 122 and the second initial insulating layer 124 may be formed of a common insulating material.

A second electrode 130 may be subsequently formed over the second initial insulating layer 124.

Figure 9D:
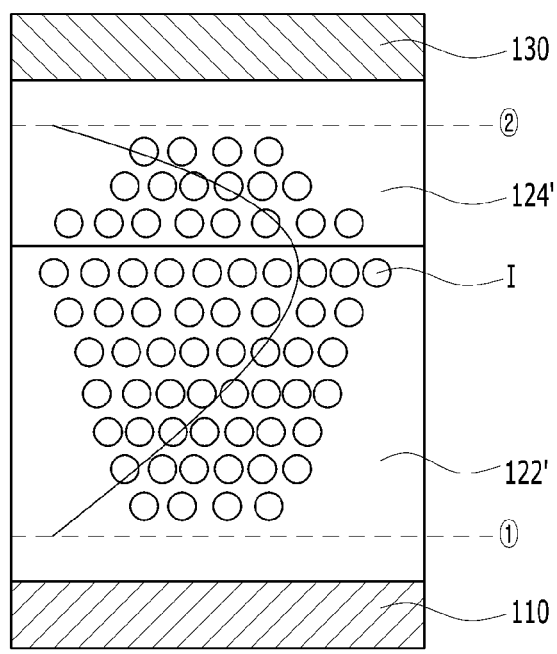

Here, in the processes of forming the second initial insulating layer 124 and/or forming the second electrode 130, some of the highly concentrated impurities contained in an upper portion of the first insulating layer 122' may diffuse into the second initial insulating layer 124. As a result, as shown in FIG. 9D, a second insulating layer 124' containing the impurities, which are distributed from a bottom surface of the second insulating layer 124' to an upward position (see the dotted line ②), may be obtained. In order to control a diffusivity of the impurities, a type of the impurities may be controlled. Considering the direction of the diffusion of the impurities, the concentration of the impurities may decrease from the bottom surface to a top surface of the second insulating layer 124'. Therefore, the concentration of the neutral defects may decrease from the bottom surface to the top surface of the second insulating layer 124'.

As a result, the selecting element may be obtained which includes the first electrode 110, the second electrode 130, and a selecting element layer including the first insulating layer 122' and the second insulating layer 124'. The selecting element layer may be located between the first electrode 110 and the second electrode 130. The selecting element layer may include impurities or neutral defects that have a certain concentration gradient. Here, as shown in the curve of FIG. 9D, the concentration of the impurities or neutral defects in the selecting element layer may be at a maximum along the interface between the first insulating layer 122' and the second insulating layer 124'. On the other hand, the concentration of the impurities or neutral defects in the selecting element layer decreases towards the interface between the first insulating layer 122' and the first electrode 110 and towards the interface between the second insulating layer 124' and the second electrode layer 130. In an implementation, no neutral defects or impurities exist in a part of the first insulating layer 122' that is within a certain distance from the interface with the first electrode 110 (see the dotted line ①) and in a part of the second insulating layer 124' that is within a certain distance from the interface with the second electrode 130 (see the dotted line ②). That is, no neutral defects or impurities may exist in either interface parts of the selecting element layer 122' and 124'. Even if the neutral defects or impurities exist in either or both interface parts of the selecting element layer 122' and 124', the concentration thereof may be minimal compared to other portions. As a result, a selecting element identical or similar to that of FIG. 2 may be implemented.

In the selecting element of FIG. 2, the off-current of the selecting element may decrease with the increase in height of a Schottky barrier formed between the selecting element layer 12 and the first electrode 11 and/or between the selecting element layer 12 and the second electrode 13 as described above. The height of the Schottky barrier may be determined by a type of a material that forms the first electrode 11 and/or the second electrode 13, and a type of a material that forms the selecting element layer 12. However, in some cases, a desired degree of the height of the Schottky barrier may not be satisfied, so it may be difficult to control the off-current of the selecting element. Also, in the implementation described in FIGS. 9A to 9D, it may be difficult to control degrees of implantation or diffusion of impurities, such that a large quantity of neutral defects may be implanted in the interface parts of the selecting element layer 122' and 124'. An implementation for solving this problem will be described with reference to FIG. 10 below.

Figure 10:
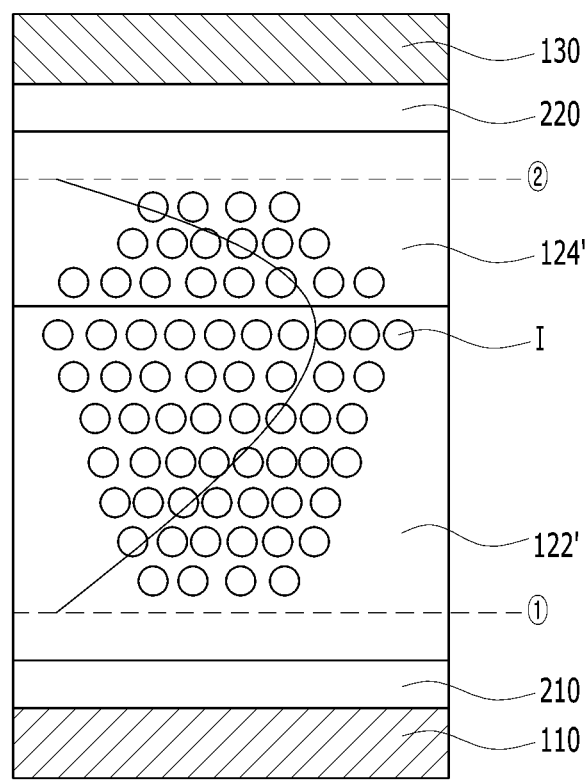
FIG. 10 illustrates a selecting element in accordance with another implementation and a method for fabricating the same.

FIG. 10 illustrates a selecting element in accordance with another implementation and a method for fabricating the same. In this implementation, a detailed description about parts which are substantially same as the implementation of FIGS. 9A to 9D may be omitted.

Referring to FIG. 10, a third insulating layer 210 may be formed over the first electrode 110 before the first initial insulating layer 122 is formed. The first initial insulating layer 122 may be formed over the third insulating layer 210, and subsequent processes, such as, a process of forming the first insulating layer 122' and a process of forming the second insulating layer 124', may be substantially the same as the implementation of FIGS. 9A to 9D. The third insulating layer 210 may include an insulating material which does not contain impurities, that is, an undoped material.

The third insulating layer 210 may be interposed between the first electrode 110 and the first insulating layer 122', and may serve as an additional interface part in which no neutral defects exist. That is, although the condition of the implantation process is wrong and the penetration depth of the impurities increases in the implantation process for forming the first insulating layer 122', the third insulating layer 210 may serve as a buffer which can alleviate this problem. For example, although the impurities are implanted into the interface part of the first insulating layer 122' during the implantation process for forming the first insulating layer 122', the third insulating layer 210 may serve as a buffer, which is less likely to be implanted with impurities than the interface part of the first insulating layer 122'.

Moreover, the third insulating layer 210 may include a material that is different from a material of the first initial insulating layer 122 and that has a larger resistance value than the first initial insulating layer 122. In this case, the off-current of the selecting element may be further reduced. Although the third insulating layer 210 exists, reduction in the on-current may be insignificant. This is because an electric field applied to the selecting element is relatively large during an operation of transforming the selecting element into the ON state. As a result, the on/off ratio of the selecting element may be further increased. Also, the third insulating layer 210 may include a material having a lower diffusivity with respect to impurities than the first initial insulating layer 122.

A fourth insulating layer 220 may be further formed after forming the first insulating layer 122' and the second insulating layer 124' and before the second electrode 130 is formed. The second electrode 130 may be formed over the fourth insulating layer 220. The fourth insulating layer 220 may include an insulating material which does not contain impurities, that is, an undoped material.

The fourth insulating layer 220 may be interposed between the second electrode 130 and the second insulating layer 124', and may serve as an additional interface part in which no neutral defects exist. That is, although a diffusion speed of the impurities is large and the diffusivity of the impurities increases in forming the second insulating layer 124', the fourth insulating layer 220 may serve as a buffer which can alleviate this problem. For example, although the diffusivity with respect to the impurities of the second insulating layer 124' is substantial, the fourth insulating layer 220 may serve as a buffer, which is less likely to be diffused with impurities than the interface part of the second insulating layer 124'.

Moreover, the fourth insulating layer 220 may include a material that is different from a material in the second initial insulating layer 124 and that has a larger resistance value than the second initial insulating layer 124. In this case, the off-current of the selecting element may be further reduced. The fourth insulating layer 220 may include a material having a lower diffusivity with respect to the impurities than the second initial insulating layer 124.

The formation of the third insulating layer 210 and/or the fourth insulating layer 220 may be optional. That is, the selecting element may include the third insulating layer 210 only, the fourth insulating layer 220 only, or both the third insulating layer 210 and the fourth insulating layer 220. According to implementations, the concentrations of the impurities in the first and second insulating layers 122' and 124' may be changed in various manners, as long as the first and second insulating layers 122' and 124' including a plurality of neutral defects may serve as a selecting element layer.

Using this implementation, it may be easier to control the off-current of the selecting element or a degree of movement of the impurities than in alternative implementations. Therefore, materials for fabricating the selecting element may be more freely selected, and fabricating the selecting element may be relatively easy.

The above and other memory circuits or semiconductor devices based on the disclosed technology can be used in a range of devices or systems. FIGS. 11-15 provide some examples of devices or systems that can implement the memory circuits disclosed herein.

Figure 11:
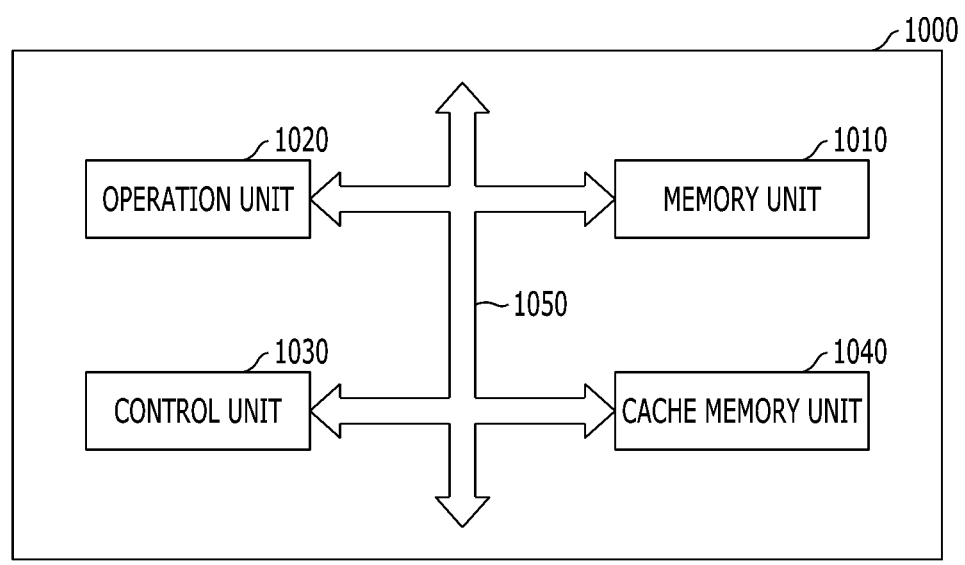
FIG. 11 is an example of configuration diagram of a microprocessor implementing memory circuitry based on the disclosed technology.

FIG. 11 is an example of configuration diagram of a microprocessor implementing memory circuitry based on the disclosed technology.

Referring to FIG. 11, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first electrode layer; a second electrode layer; an insulating layer interposed between the first and second electrode layers and containing a plurality of neutral defects; and an additional insulating layer interposed between the insulating layer and one or each of the first and second electrode layers, and being substantially free from neutral defects, and wherein the threshold switching device has an ON or OFF state according to whether electrons are ejected from the plurality of neutral defects. Through this, reliability and operating storage characteristics of the memory unit 1010 may be improved. As a consequence, reliability and operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 12:
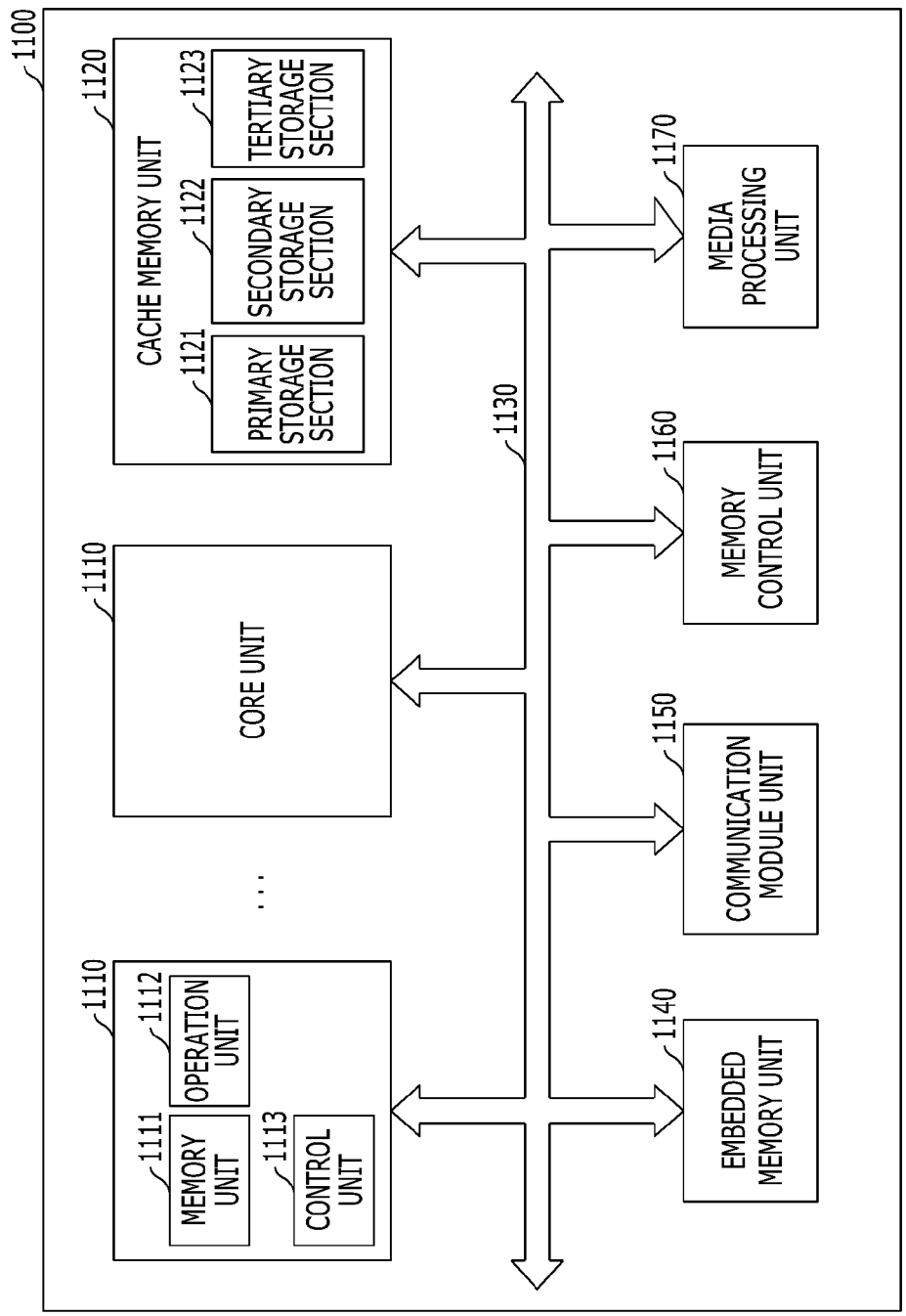
FIG. 12 is an example of configuration diagram of a processor implementing memory circuitry based on the disclosed technology.

FIG. 12 is an example of configuration diagram of a processor implementing memory circuitry based on the disclosed technology.

Referring to FIG. 12, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first electrode layer; a second electrode layer; an insulating layer interposed between the first and second electrode layers and containing a plurality of neutral defects; and an additional insulating layer interposed between the insulating layer and one or each of the first and second electrode layers, and being substantially free from neutral defects, and wherein the threshold switching device has an ON or OFF state according to whether electrons are ejected from the plurality of neutral defects. Through this, reliability and operating characteristics of the cache memory unit 1120 may be improved. As a consequence, reliability and operating characteristics of the processor 1100 may be improved.

Although it was shown in FIG. 11 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 13:
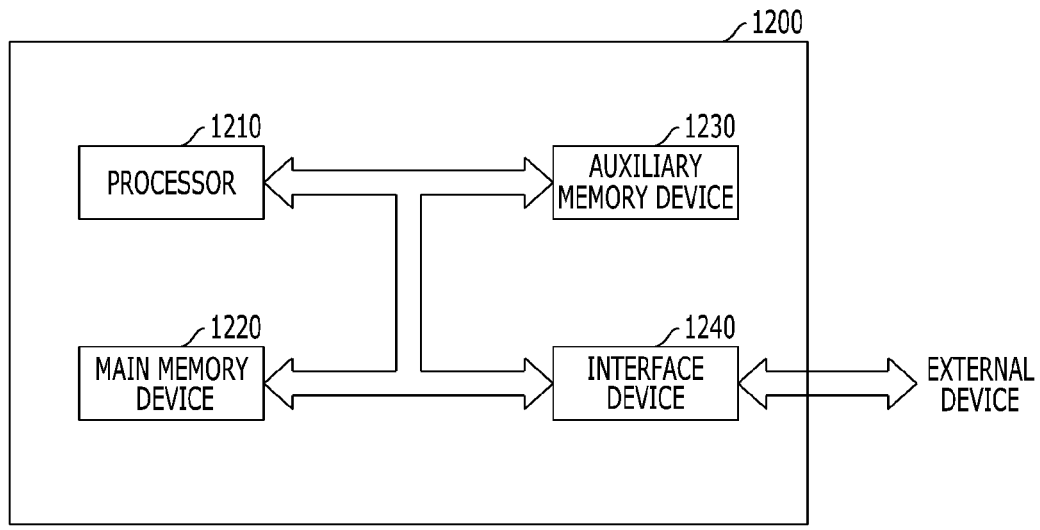
FIG. 13 is an example of configuration diagram of a system implementing memory circuitry based on the disclosed technology.

FIG. 13 is an example of configuration diagram of a system implementing memory circuitry based on the disclosed technology.

Referring to FIG. 13, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first electrode layer; a second electrode layer; an insulating layer interposed between the first and second electrode layers and containing a plurality of neutral defects; and an additional insulating layer interposed between the insulating layer and one or each of the first and second electrode layers, and being substantially free from neutral defects, and wherein the threshold switching device has an ON or OFF state according to whether electrons are ejected from the plurality of neutral defects. Through this, reliability and operating characteristics of the main memory device 1220 may be improved. As a consequence, reliability and operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first electrode layer; a second electrode layer; an insulating layer interposed between the first and second electrode layers and containing a plurality of neutral defects; and an additional insulating layer interposed between the insulating layer and one or each of the first and second electrode layers, and being substantially free from neutral defects, and wherein the threshold switching device has an ON or OFF state according to whether electrons are ejected from the plurality of neutral defects. Through this, reliability and operating characteristics of the auxiliary memory device 1230 may be improved. As a consequence, reliability and operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 14:
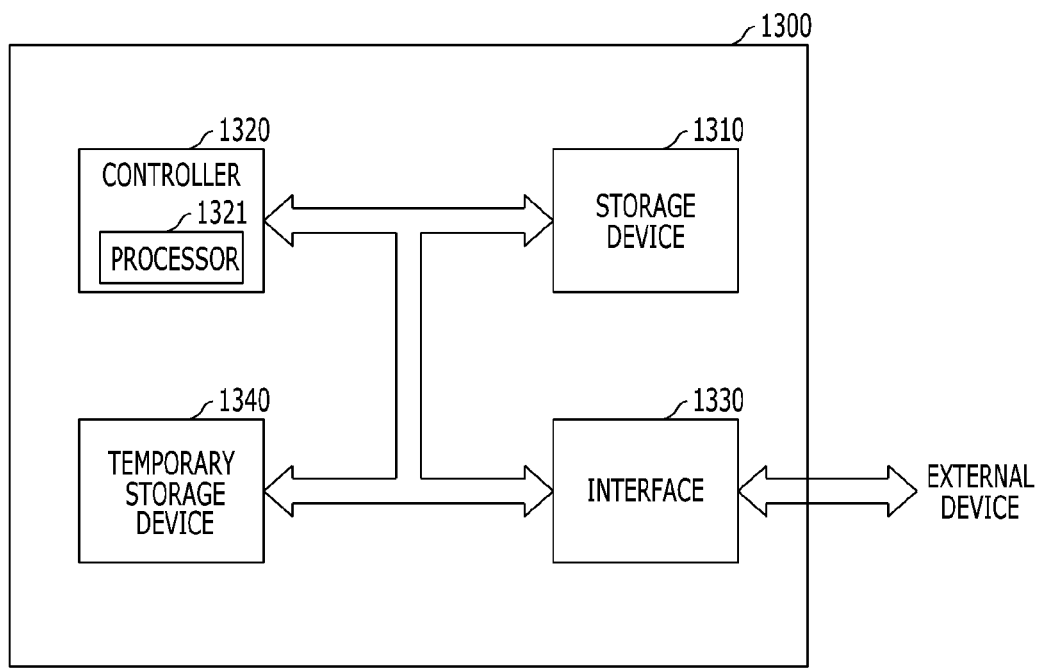
FIG. 14 is an example of configuration diagram of a data storage system implementing memory circuitry based on the disclosed technology.

FIG. 14 is an example of configuration diagram of a data storage system implementing memory circuitry based on the disclosed technology.

Referring to FIG. 14, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first electrode layer; a second electrode layer; an insulating layer interposed between the first and second electrode layers and containing a plurality of neutral defects; and an additional insulating layer interposed between the insulating layer and one or each of the first and second electrode layers, and being substantially free from neutral defects, and wherein the threshold switching device has an ON or OFF state according to whether electrons are ejected from the plurality of neutral defects. Through this, reliability and operating characteristics of the storage device 1310 or the temporary storage device 1340 may be improved. As a consequence, reliability and operating characteristics of the data storage system 1300 may be improved.

Figure 15:
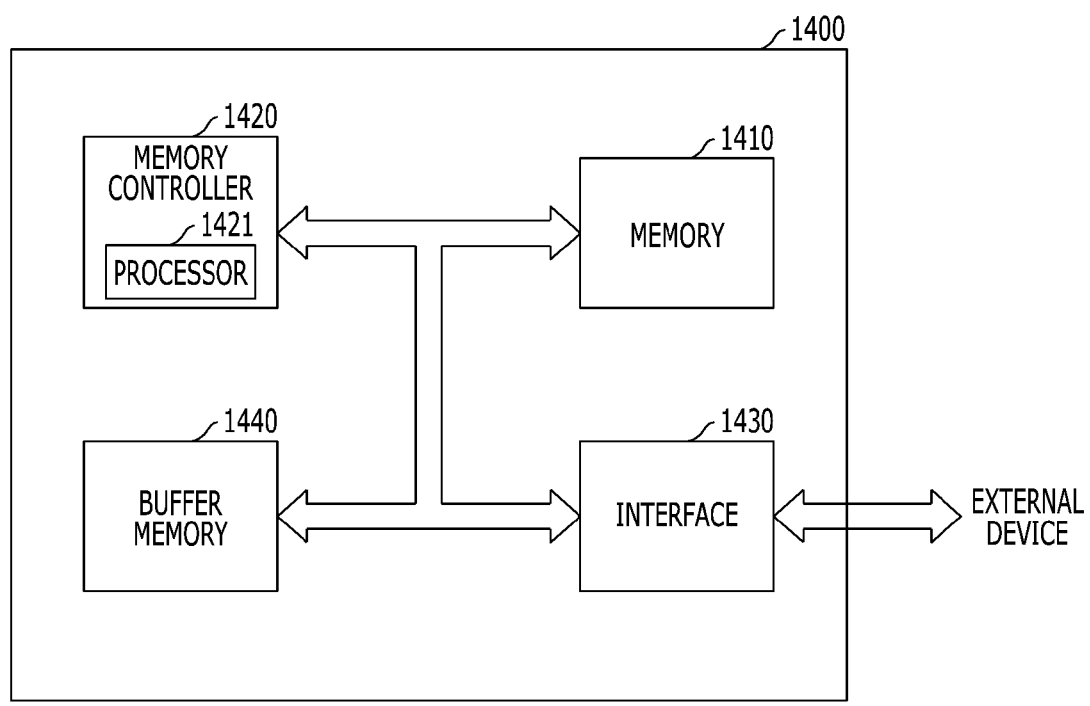
FIG. 15 is an example of configuration diagram of a memory system implementing memory circuitry based on the disclosed technology.

FIG. 15 is an example of configuration diagram of a memory system implementing memory circuitry based on the disclosed technology.

Referring to FIG. 15, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first electrode layer; a second electrode layer; an insulating layer interposed between the first and second electrode layers and containing a plurality of neutral defects; and an additional insulating layer interposed between the insulating layer and one or each of the first and second electrode layers, and being substantially free from neutral defects, and wherein the threshold switching device has an ON or OFF state according to whether electrons are ejected from the plurality of neutral defects. Through this, reliability and operating characteristics of the memory 1410 may be improved. As a consequence, reliability and operating characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first electrode layer; a second electrode layer; an insulating layer interposed between the first and second electrode layers and containing a plurality of neutral defects; and an additional insulating layer interposed between the insulating layer and one or each of the first and second electrode layers, and being substantially free from neutral defects, and wherein the threshold switching device has an ON or OFF state according to whether electrons are ejected from the plurality of neutral defects. Through this, reliability and operating characteristics of the buffer memory 1440 may be improved. As a consequence, reliability and operating characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 11-15 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A threshold switching device comprising:
    a first electrode layer;
    a second electrode layer;
    an insulating layer interposed between the first and second electrode layers and containing a plurality of neutral defects; and
    an additional insulating layer interposed between the insulating layer and one or each of the first and second electrode layers, and being substantially free from neutral defects,
    wherein the threshold switching device has an ON or OFF state according to whether electrons are ejected from the plurality of neutral defects, and
    wherein the additional insulating layer includes an insulating material having a larger resistance than the insulating layer, and having a lower diffusive with respect to impurities than the insulating layer.

2. The threshold switching device of claim 1, wherein the insulating layer includes a doped material, and the additional insulating layer includes an undoped material.

3. The threshold switching device of claim 1, wherein when no voltage is applied to the first and second electrode layers, the plurality of neutral defects have substantially the same energy level as or a lower energy level than a work function of the first and second electrode layers.

4. The threshold switching device of claim 1, wherein the plurality of neutral defects in the insulating layer are arranged at predetermined intervals along a first direction toward the second electrode layer from the first electrode layer.

5. The threshold switching device of claim 1, wherein when a relatively positive voltage is applied to the second electrode layer in comparison to the first electrode layer, the ejection of electrons is sequentially performed starting from neutral defects close to the second electrode layer and progressing to neutral defects close to the first electrode layer.

6. The threshold switching device of claim 1, wherein the insulating layer includes a first insulating layer adjacent to the first electrode layer and a second insulating layer adjacent to the second electrode layer, and
    a concentration of the plurality of neutral defects is at a maximum along an interface between the first insulating layer and the second insulating layer.

7. The threshold switching device of claim 6, wherein the concentration of the plurality of neutral defects decreases along a direction away from the interface between the first insulating layer and the second insulating layer.

8. The threshold switching device of claim 1, wherein in the ON state, an ohmic contact is formed by the ejection of electrons from the plurality of neutral defects and formed between the first electrode layer and the insulating layer, between the second electrode layer and the insulating layer, or both, and
in the OFF state, a Schottky contact is formed by maintaining the plurality of neutral defects without the electrons being ejected, and formed between the first electrode layer and the insulating layer, between the second electrode layer and the insulating layer, or both.

9. The threshold switching device of claim 1, wherein a current flowing through the insulating layer in the OFF state decreases when a height of a Schottky barrier increases, the Schottky barrier being formed between the first electrode layer and the insulating layer, between the second electrode layer and the insulating layer, or both.

10. The threshold switching device of claim 1, wherein a current flowing through the insulating layer in the ON state increases according to an increased concentration of the plurality of neutral defects.

11. An electronic device comprising a semiconductor memory,
    wherein the semiconductor memory comprises:
    a memory element suitable for storing data; and
    a selecting element coupled to the memory element and suitable for controlling access to the memory element,
    wherein the selecting element comprises:
        a first electrode layer;
        a second electrode layer;
        an insulating layer interposed between the first and second electrode layers and containing a plurality of neutral defects; and
        an additional insulating layer interposed between the insulating layer and one or each of the first and second electrode layers, and being substantially free from neutral defects, and
    wherein the threshold switching device has an ON or OFF state according to whether electrons are ejected from the plurality of neutral defects.

12. The electronic device of claim 11, wherein the semiconductor memory further comprises:
    a first line extending in a first direction; and
    a second line extending in a second direction crossing the first direction, and
    wherein the memory element and the selecting element are positioned at an intersection between the first and second lines.

13. The electronic device of claim 11, wherein the memory element comprises a variable resistance element which switches between different resistance states according to a voltage or current applied thereto.

14. The electronic device of claim 11, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory is part of the memory unit in the microprocessor.

15. The electronic device of claim 11, further comprising a processor which includes:
    a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

16. The electronic device of claim 11, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

17. The electronic device according of 11, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

18. The electronic device of claim 11, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

19. An electronic device comprising a semiconductor memory, wherein the semiconductor memory comprises:

a first electrode;

a first insulating layer over the first electrode;

a second insulating layer over the first insulating layer;

a second electrode over the second insulating layer; and a memory element over the second electrode, wherein the first insulating layer and the second insulating layer comprise a plurality of neutral defects, and wherein the neutral defects comprise immobile defects and mobile electrons.

20. The electronic device of claim 19, wherein a concentration of the plurality of neutral defects is at a maximum along an interface between the first insulating layer and the second insulating layer.

21. The electronic device of claim 19, further comprising:

a third insulating layer between the first electrode and the first insulating layer; and a fourth insulating layer between the second insulating layer and the second electrode, wherein the third insulating layer and the fourth insulating layer are substantially free from the neutral defects.

22. The electronic device of claim 21, wherein a concentration of the plurality of neutral defects decrease closer to interfaces between the first insulating layer and the third insulating layer and between the second insulating layer and the fourth insulating layer.

* * * * *